United States Patent
Cho et al.

(10) Patent No.: US 7,893,860 B2
(45) Date of Patent: Feb. 22, 2011

(54) SUCCESSIVE APPROXIMATION REGISTER ANALOG-DIGITAL CONVERTER AND METHOD OF DRIVING THE SAME

(75) Inventors: Young Kyun Cho, Daejeon (KR); Young Deuk Jeon, Daejeon (KR); Jae Won Nam, Daejeon (KR); Jong Kee Kwon, Daejeon (KR)

(73) Assignee: Electronic and Telecommunications Research Institute, Daejeon (KR)

( * ) Notice: Subject to any disclaimer, the term of this patent is extended or adjusted under 35 U.S.C. 154(b) by 13 days.

(21) Appl. No.: 12/472,375

(22) Filed: May 27, 2009

(65) Prior Publication Data

US 2010/0123611 A1    May 20, 2010

(30) Foreign Application Priority Data

Nov. 19, 2008    (KR) .................. 10-2008-0115053

(51) Int. Cl.
*H03M 1/38* (2006.01)
(52) U.S. Cl. ....................... 341/161; 341/155
(58) Field of Classification Search ............ 341/118, 341/120, 161, 172, 155
See application file for complete search history.

(56) References Cited

U.S. PATENT DOCUMENTS

| | | | |
|---|---|---|---|
| 4,399,426 A * | 8/1983 | Tan ............... | 341/120 |
| 6,424,276 B1 | 7/2002 | Munoz et al. | |
| 6,486,806 B1 | 11/2002 | Munoz et al. | |
| 6,894,627 B2 | 5/2005 | Janakiraman et al. | |
| 7,187,317 B2 * | 3/2007 | Oka ............... | 341/156 |
| 7,342,530 B2 | 3/2008 | Kuttner | |
| 7,501,965 B2 * | 3/2009 | Janakiraman ............ | 341/118 |
| 2004/0227652 A1 | 11/2004 | Draxelmayr | |
| 2007/0075884 A1 | 4/2007 | Melanson et al. | |
| 2008/0001804 A1 | 1/2008 | Draxelmayr | |
| 2008/0084340 A1 | 4/2008 | Hurrell | |

OTHER PUBLICATIONS

Vito Giannini et. al., "An 820 µW 9b 40MS/s Noise-Tolerant Dynamic-SAR ADC in 90nm Digital CMOS," 2008 IEEE International Solid-State Circuits Conference, Feb. 5, 2008, pp. 238-239, 610.

Franz Kuttner, "A 1.2V 10b 20MSample/s Non-Binary Successive Approximation ADC in 0.13 µm CMOS," 2002 IEEE International Solid-State Circuits Conference, Feb. 5, 2002.

Shuo-Wei Michael Chen et. al., "A 6-bit 600-MS/s 5.3-mW asynchronous ADC in 0.13-µm CMOS," IEEE Journal of Solid-State Circuits, Dec. 2006, pp. 2669-2680, vol. 41, No. 12.

* cited by examiner

*Primary Examiner*—Brian Young (57) ABSTRACT

A successive approximation register (SAR) analog-digital converter (ADC) and a method of driving the same are provided. The SAR ADC includes a first converting unit including a bit capacitor array corresponding to the number of bits and a correction capacitor array, a comparator outputting a high or low voltage corresponding to each capacitor according to an output voltage of the converting unit, and a correction unit correcting the output of the bit capacitor according to the output of the correction capacitor array among the high or low output of the comparator. Therefore, two bits having the same capacitance as a least significant bit (LSB) enable a digital output error to be corrected, so that a spurious free dynamic range (SFDR) of the signal converter is increased, and a signal to noise and distortion ratio (SNDR) of an output signal is improved.

11 Claims, 5 Drawing Sheets

SUCCESSIVE APPROXIMATION REGISTER ANALOG-DIGITAL CONVERTER AND METHOD OF DRIVING THE SAME

CROSS-REFERENCE TO RELATED APPLICATION

This application claims priority to and the benefit of Korean Patent Application No. 10-2008-0115053, filed Nov. 19, 2008, the disclosure of which is incorporated herein by reference in its entirety.

BACKGROUND

1. Field of the Invention

The present invention relates to a successive approximation register (SAR) analog-digital converter (ADC). In particular, the present invention relates to a SAR ADC capable of performing correction on an error code that is generated during operation, and a method of driving the same.

2. Discussion of Related Art

A successive approximation register (SAR) analog-digital converter (ADC) includes a binary capacitor array, a comparator, and a controller, and converts an analog voltage into a digital signal during a sample mode and a hold mode.

The current SAR ADC is highlighted in a region having a resolution of 8 to 16 bits and a conversion rate of 5 to 100 MS/s. The SAR ADC is on the rise as a next-generation data converter with high-efficiency due to its low electric power consumption.

Despite its advantages, the SAR ADC fixes an input, and searches for a digital output that is the closest to the input by successively changing a reference voltage, so that an error is generated during the conversion.

When an error occurs in the SAR ADC, it cannot be corrected. That is, although a desired digital code is 10100, when D2 code outputs a value of 0 for whatever reason, a general SAR ADC outputs a digital code of 10011. Once a digital bit is determined, correction thereof is not possible, and thus lower order bits may be given an effect.

SUMMARY OF THE INVENTION

The present invention is directed to a successive approximation register (SAR) analog-digital converter (ADC) capable of correcting an error of a finally output digital code, so that the error that is generated during operation is corrected.

One aspect of the present invention provides a SAR ADC converting an analog voltage into a digital signal having a specific number of bits according to a successive approximation operation, including: a converting unit including a bit capacitor array corresponding to the number of bits and a correction capacitor array; a comparator outputting a high or low voltage corresponding to each capacitor according to an output voltage of the converting unit; and a correction unit correcting the digital signal of the bit capacitor array according to the digital signal of the correction capacitor array among digital signals corresponding to a high or low voltage of the comparator.

The correction capacitor array may be formed between an input terminal of the comparator and a first or second reference voltage, and may include a first correction capacitor and a second correction capacitor that are connected in an opposite manner.

The correction capacitor array may perform a successive approximation operation after a successive approximation operation of the bit capacitor array is completed.

The first correction capacitor may calculate the same value as a capacitor corresponding to a least significant bit (LSB) of the bit capacitor array.

The first and second correction capacitors may have the same capacitance as the capacitor of the bit capacitor array corresponding to the LSB.

The SAR ADC may further include an offset compensation capacitor compensating for an offset of the comparator.

The correction unit may add 1 to the digital signal of the bit capacitor array when the digital signals of the first and second correction capacitors are 11, output the digital signal of the bit capacitor array as it is when the digital signals of the first and second correction capacitors are 10 or 01, and deduct 1 from the digital signal of the bit capacitor array when the digital signals of the first and second correction capacitors are 00.

Another aspect of the present invention provides a method of driving a SAR ADC including a bit capacitor array corresponding to each bit and first and second correction capacitors, including: sampling an input analog voltage in the bit capacitor array; performing a successive approximation operation from a bit capacitor corresponding to a most significant bit (MSB) to a bit capacitor corresponding to a LSB to determine a digital value of 1 or 0; performing a successive approximation operation to determine whether the first and second correction capacitors have a digital value of 1 or 0; and correcting the digital value of the bit capacitor according to the digital value of the first and second correction capacitors.

The sampling of an input analog voltage may comprise connecting the first correction capacitor to a first reference voltage, and connecting the second correction capacitor to a second reference voltage.

The successive approximation operation may be performed by connecting the corresponding capacitor to the first reference voltage, and connecting other capacitors to the second reference voltage.

The correcting of the digital value of the bit capacitor may comprise adding 1 to the digital value of the bit capacitor when the digital values of the first and second correction capacitors are 11, outputting the digital value of the bit capacitor as it is when the digital values of the first and second correction capacitors are 10 or 01, and deducting 1 from the digital value of the bit capacitor when the digital values of the first and second capacitors are 00.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. In the drawings, portions irrelevant to description of the present invention are omitted for clarity, and like reference numerals denote like elements.

When a portion is described as "connected to" an element, it may be interpreted that the portion is "directly connected to" the element, or that it is "electrically connected to" the element with an element interposed therebetween.

Throughout the specification, it will be understood that when a portion "includes" an element, it is not intended to exclude other elements but can further include other elements. Also, terms, such as "portion," group, and "module," may be used herein to refer to units for processing at least one function or operation and implemented in hardware, software, or a suitable combination of hardware and software.

A successive approximation register (SAR) analog-digital converter (ADC) according to an exemplary embodiment of the present invention will be described with reference to FIGS. 1 and 2.

Figure 1:
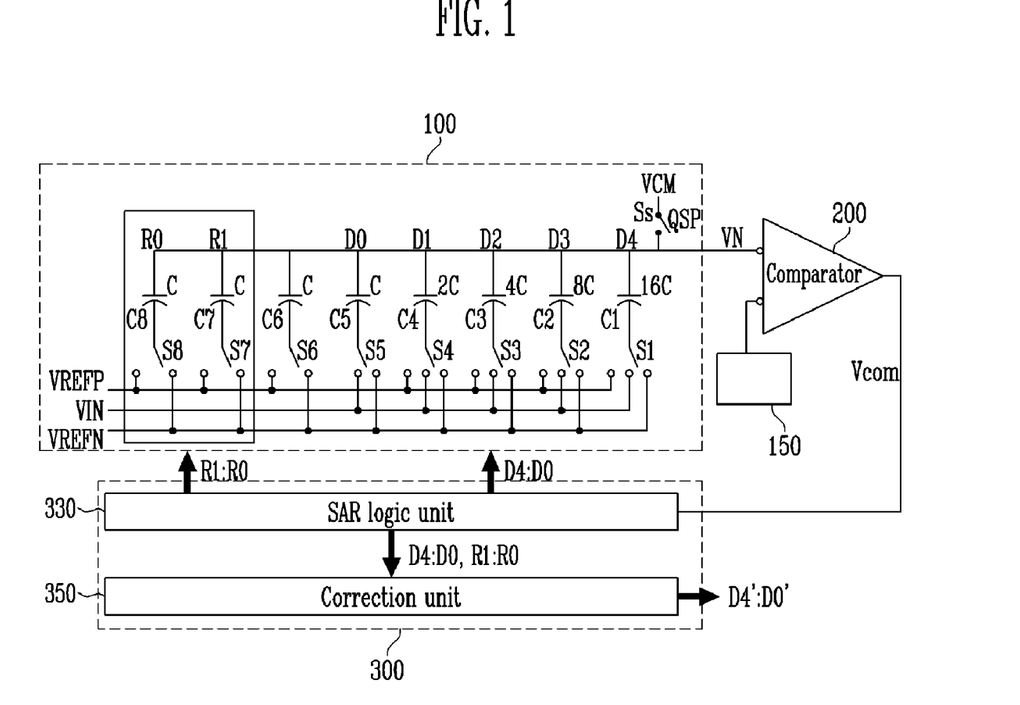
FIG. 1 is a diagram of a successive approximation register (SAR) analog-digital converter (ADC) according to an exemplary embodiment of the present invention.
Figure 2:
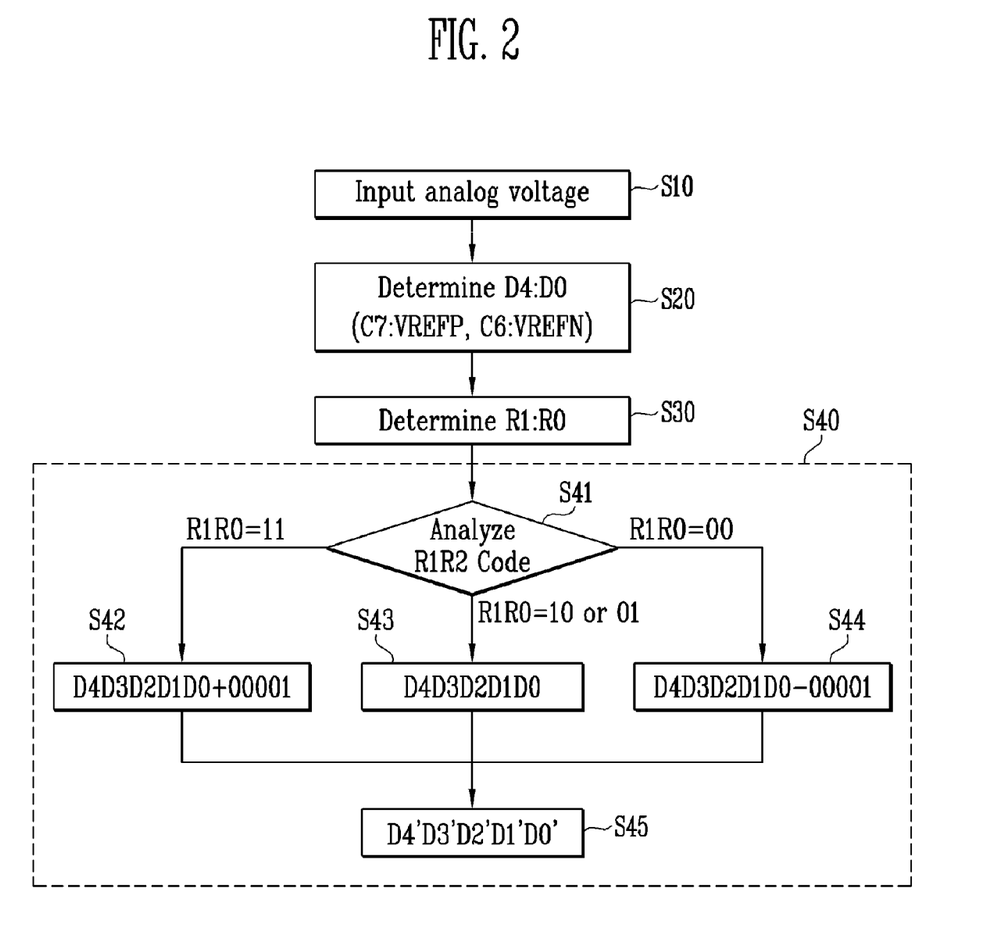
FIG. 2 is a flowchart of operations of the SAR ADC illustrated in FIG. 1.

FIG. 1 is a diagram of a SAR ADC according to an exemplary embodiment of the present invention, and FIG. 2 is a flowchart of operations of the SAR ADC illustrated in FIG. 1.

Referring to FIG. 1, the SAR ADC according to the exemplary embodiment of the present invention includes a first conversion array 100, a second conversion array 150, a comparator 200, and a controller 300.

The first conversion array 100 includes a plurality of capacitors C1 to C8, and is connected to a first input terminal VN of the comparator 200.

The number of capacitors C1 to C8 is determined depending on resolution, and it is assumed that it has a resolution of 5 bits for clarity.

The first conversion array 100 includes five capacitors C1 to C5 corresponding to a resolution of 5 bits, an offset capacitor C6 and two correction capacitors C7 and C8.

The eight capacitors C1 to C8 of the first conversion array 100 have one ends connected to the first input terminal VN of the comparator 200, and the other ends selectively connected to a first reference voltage VREFP, a second reference voltage VREFN or an input analog voltage VIN through switches S1 to S8.

The five capacitors C1 to C5 are defined depending on each bit from a least significant bit (LSB) to a most significant bit (MSB). A capacitance of the first capacitor C1 corresponding to the MSB is 16C, a capacitance of the second capacitor C2 corresponding to a next bit is 8C, a capacitance of the third capacitor C3 is 4C, a capacitance of the fourth capacitor C4 is 2C, and a capacitance of the fifth capacitor C5 corresponding to the LSB is C. Furthermore, capacitances of the offset capacitor C6 and the correction capacitors C7 and C8 are the same as the capacitance of the fifth capacitor C5 corresponding to the LSB.

The second conversion array 150 has the same constitution as the first conversion array 100, the eight capacitors of the array are connected to the second input terminal of the comparator 200, and its electrical power connection is in an opposite manner to the first conversion array.

The comparator 200 has the first input terminal VN, the second input terminal and the output terminal, and the first input terminal VN and the second input terminal are respectively connected to the first conversion array 100 and the second conversion array 150. Further, the comparator 200 outputs a high or low output voltage Vcom to a SAR logic unit 330 of the controller 300 depending on a differential voltage between a voltage of the first input terminal VN and that of the second input terminal.

The controller 300 includes the SAR logic unit 330 and a correction unit 350. The SAR logic unit 330 sets digital signals D4:D0 and R1:R0 to a high or low level to control the switches S1 to S8 of the capacitors C1 to C8, and provides the signals to the switches S1 to S8. Also, the SAR logic unit 330 receives the output voltage Vcom from the comparator 200, and converts the received results into a digital signal to be transmitted to the correction unit 350.

The correction unit 350 receives a digital signal D4:D0 converted from the input analog voltage VIN from the SAR logic unit 330, and a converted correction digital signal R1:R0 from the correction capacitors C7 and C8, and corrects the digital signal D4:D0 depending on the correction digital signal R1:R0 to output the corrected results.

In the present invention, while a converter using a binary capacitor array is constituted for clarity, a converter using a split capacitor and a resistor, and a converter using a unit capacitor array may be implemented in the same manner.

Operation of the SAR ADC illustrated in FIG. 1 will be described below with reference to FIG. 2.

First, a sampling switch Ss is turned on according to a control signal QSP in a sampling mode, and applies a common voltage VCM to the first input terminal VN and the second input terminal of the comparator 200. Here, the first to fifth capacitors C1 to C5 and the offset capacitor C6 are connected to the input analog voltage VIN. Further, in order not to have an effect on the operation of a circuit, a first correction capacitor C7 of the correction capacitors C7 and C8 is connected to the first reference voltage VREFP, and a second correction capacitor C8 is connected to the second reference voltage VREFN.

While it is possible to simultaneously connect the correction capacitors C7 and C8 to the common voltage VCM, in order for a circuit to which a correction method is applied to preferably operate, one of the correction capacitors C7 and C8 may be connected to the first reference voltage VREFP, and the other may be connected to the second reference voltage VREFN.

When the sampling mode is completed, the sampling switch Ss is turned off, and the input analog voltage VIN is stored in the capacitor arrays C1-C8 (S10).

When the analog voltage VIN is sampled in the capacitor arrays C1 to C8, a redistribution mode begins. The SAR logic unit 330 sets D4 to a high level, connects a first switch S1 to the first reference voltage VREFP, sets bits of D3 to D0 to a low level, and connects second to fifth switches S2 to S5 to the second reference voltage VREFN.

The offset capacitor C6 is connected to the second reference voltage VREFN during the redistribution mode ranging from D4 to R0 to compensate for an offset.

In the meantime, the correction capacitors C7 and C8 maintain the above-mentioned bias condition, i.e., they are respectively connected to the first reference voltage VREFP and the second reference voltage VREFN until the redistribution mode D0 is finished.

When D4 becomes a high level, the comparator 200 outputs a high or low output signal Vcom according to a differential voltage between the first input terminal VIN and the second input terminal.

The SAR logic unit 330 determines whether a bit of D4 is a value of 1 or 0 according to the output signal Vcom of the comparator 200.

After the SAR logic unit 330 determines the bit of D4, it sets D3 to a high level to be applied to a third switch, so that it performs a redistribution mode of the third capacitor. Then, it successively performs a redistribution mode up to the LSB, so that a bit of D4:D0 is determined (S20).

Next, a correction mode is performed in order to correct an error that may be generated during the redistribution mode.

After the redistribution mode is performed to determine a bit of D4:D0, the SAR logic unit 330 applies R1 of a high level to a seventh switch S7 so that the seventh switch S7 is connected to the second reference voltage VREFN. That is, after the second reference voltage VREFN is applied to the other end of the first correction capacitor C7 to lower a voltage by as much as 1 LSB, the first reference voltage VREFP is applied to the other end of the first correction capacitor C7 again to perform a successive approximation process.

However, even though the other end of the first correction capacitor C7 is lowered to the second reference voltage VREFN to be connected to the first reference voltage VREFP again, the voltage of the first input terminal VN is not changed, and thus the connection of the other end of the first correction capacitor C7 to the second reference voltage VREFN may be omitted.

As above, R1 bit functions to calculate D0 bit again.

After R1 bit is determined through the redistribution mode, R0 bit is determined using a general successive approximation process (S30).

The correction unit 350 receives determined R1:R0 bit and D4:D0 bit, corrects D4:D0 bit according to R1:R0 bit, and outputs corrected D4':D0' (S40).

A method of correcting an error through R1:R0 will be described below.

In the previously mentioned example, although an accurate conversion digital signal with respect to an input analog voltage is 10100, a value recognized by the SAR logic unit 330 is 10011, which is an error. Therefore, when R1 and R0 are calculated under these circumstances, R1 is obtained by performing a successive approximation process while it is lowered by as much as 1 LSB, and as if D0 were calculated again, an output of a high level is generated.

R0 calculates a next LSB, and the code 10011 calculated up to R1 is less than the original value of 10100 by as much as 1 or higher, and thus R0 outputs 1 as well.

In another example, when up to D4:D0 is output without an error, a successive approximation process is performed while it is lowered by as much as 1 LSB so that R1:R0 generates code 01 or 10.

Ultimately, when D4:D0 is output as 11000 greater than the original value of 10111, R1 and R0 output 00 in the same manner.

The correction unit 350 receives D4:D0 and R1:R0, analyzes the received results, and corrects D0:D4.

When an output of R1:R0 is 11, since the output digital value is less than the original voltage value, 1 is added to the originally output digital code (S42).

When a value of R1:R0 is 00, since the output digital value is greater than the original voltage value, 1 is deducted (S43), and when the output digital value is 10 or 01, the originally output value is output as it is (S44).

As described above, the correction unit 350 corrects D4:D0 according to R1:R0, and generates D4':D0' (S45).

A SAR ADC according to another exemplary embodiment of the present invention will be described below with reference to FIGS. 3 and 4.

Figure 3:
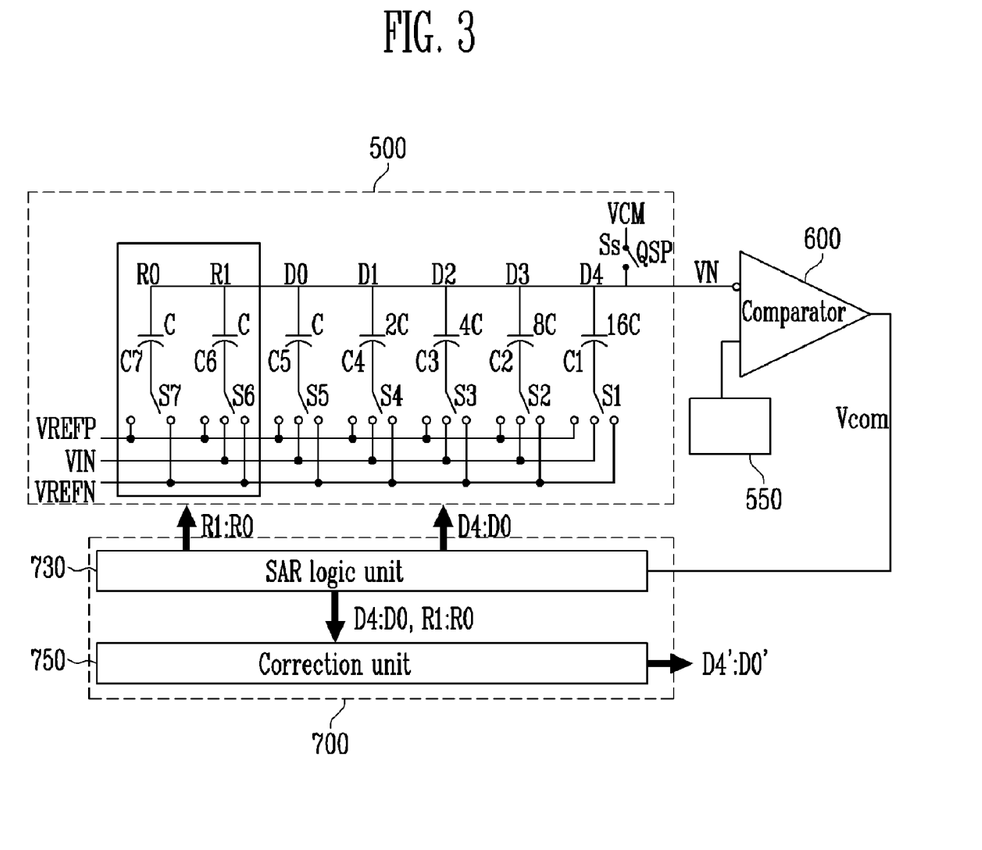
FIG. 3 is a diagram of a SAR ADC according to another exemplary embodiment of the present invention.
Figure 4:
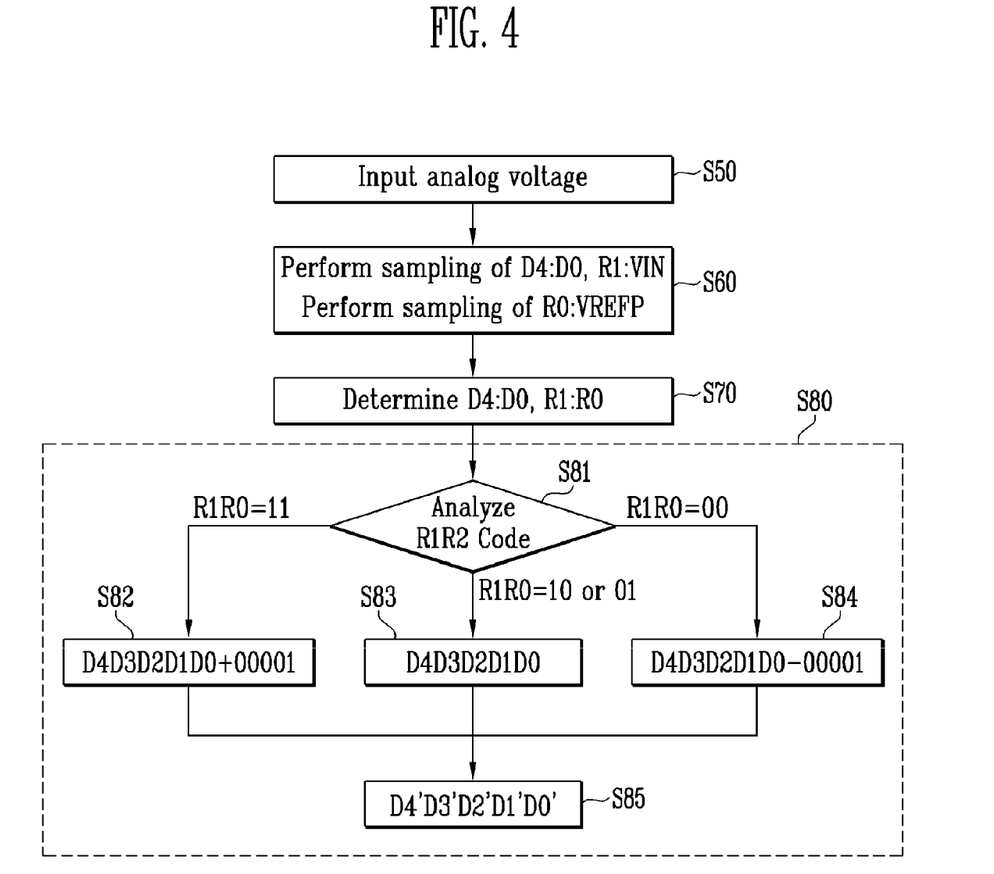
FIG. 4 is a flowchart illustrating operations of the SAR ADC illustrated in FIG. 3.

As illustrated in FIG. 3, while a SAR ADC according to another exemplary embodiment of the present invention is similar to the circuit of FIG. 1, an offset correction capacitor and a first correction capacitor operate as one capacitor.

That is, the SAR ADC includes capacitors C1 to C5 corresponding to each bit, and further includes first and second correction capacitors C6 and C7.

Here, the first correction capacitor C6 is selectively connected to first and second reference voltages VREFP and VREFN and analog voltage VIN through a switch S6.

Therefore, in a case of 5 bits, the number of capacitors C1 to C7 is an odd number in a second exemplary embodiment.

Describing the general operations of the circuit of FIG. 3, when an input analog voltage VIN to be converted is applied as in the first exemplary embodiment (S50), the capacitors C1 to C6, excluding the second correction capacitor C7, are connected to the analog voltage VIN, and the second correction capacitor C7 is connected to a second reference voltage VREFP.

When the input terminal VN is disconnected from a common voltage by a QSP signal, sampling is completed, so that the input analog voltage VIN is stored in a capacitor array.

In order to reduce an offset that is generated by the conversion of digital to analog during sampling, an upper end of a capacitor array of a positive digital analog converting unit 500 may be connected to an upper end of a capacitor array of a negative digital analog converting unit 550 using a switch employing the QSP clock.

When an analog voltage is sampled in the capacitor array (S60), the ADC according to another exemplary embodiment of the present invention operates according to the general successive approximation process.

First, a SAR logic unit 730 sets D4 to a high level such that a lower end of a first capacitor C1 is connected to the first reference voltage VREFP, and bits of D3 to D0 are set to a low level, so that lower ends of second to fifth capacitors C2 to C5 are connected to the second reference voltage VREFN.

In the meantime, unlike the first exemplary embodiment, lower ends of first and second correction capacitors C6 and C7 are connected to the second reference voltage VREFN to perform the conversion like the capacitors C2 to C5.

When D4 of a high level is applied to the first capacitor C1, a comparator 600 outputs a high or low level signal according to a voltage difference between both input terminals.

When a bit of D4 is determined by the high or low level output, a high level signal is applied to D3, so that the next conversion process is performed, and the other bits are determined by the general successive approximation method (S70).

That is, in order to determine 5 bits, a final code is determined through seven conversion processes, and in order to correct an error of an analog-digital conversion having N-bit resolution, N+2 conversion processes are required.

Therefore, in order to accomplish the above, two correction capacitors are required.

When conversion up to R0 is completed, the SAR logic unit 730 outputs D4:D0 data and R1 and R0 data to a correction unit 750. The correction unit 750 receives and compares the data, and outputs final codes D4'~D0' (S80).

Processes of correcting an error by a correction bit in the second exemplary embodiment will be described below.

The first reference voltage VREFP connected to a lower end of C7 during a sampling mode is connected to the second reference voltage VREFN in the process of conversion. Thus, outputs of D4 to D0 are compared with a case when there is no R0, and a code lowered by as much as 1 LSB is output.

That is, when there is no R0, the suggested circuit is the same as the general SAR ADC to which an error correction method is not applied. When R1:R0 code is determined after D0 that is lowered by as much as 1 LSB is determined, an error as much as 1 LSB can be corrected.

Another exemplary embodiment is different from an exemplary embodiment in terms of total capacitances, odd-numbered capacitors, and making a code that is lowered by as much as 1 LSB from the total code.

The correction unit 750 receives D4 to D0, R1 and R0, and corrects D4:D0 according to R1 and R0. When R1 and R0 are 11, 1 is added to the originally output digital code (S82), when R1 and R0 are 00, 1 is deducted (S84), and when R1 and R0 are 10 or 01, the original output is output as it is (S83) to generate corrected D4':D0' (S85).

Figure 5:
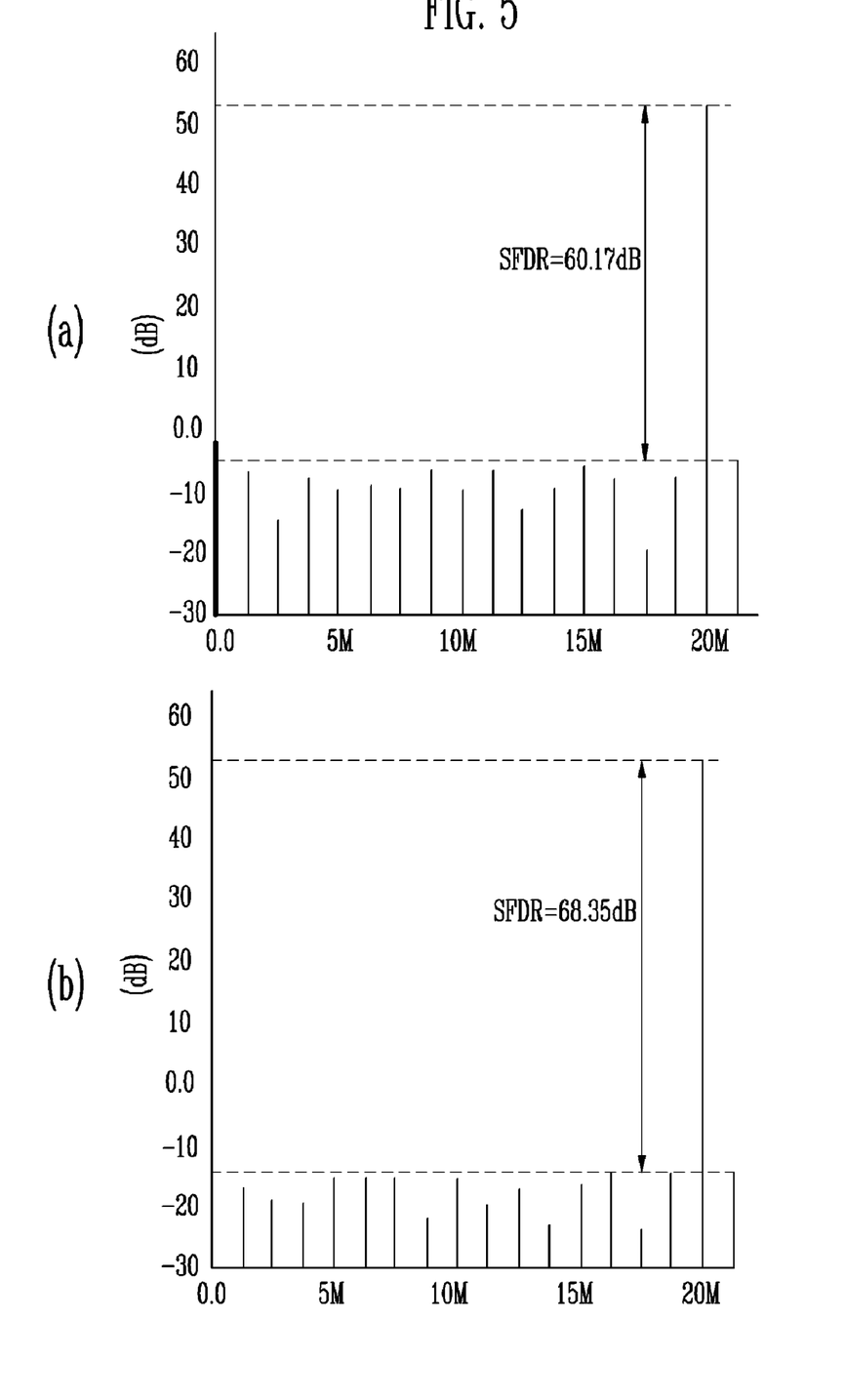
FIGS. 5A and 5B are graphs illustrating effects of the present invention.

Examining effects of the present invention with reference to FIGS. 5A and 5B, FIG. 5A illustrates a digital output of the general SAR ADC, and FIG. 5B illustrates a digital output of the SAR ADC according to an exemplary embodiment of the present invention.

A structure in which a capacitor array has 10-bit resolution was used for simulation, and the SAR ADC operated at a conversion rate of 40 MS/s.

The simulation results are fast Fourier transform (FFT) results, and are used as a tool for evaluating performance of a general ADC.

A spurious free dynamic range (SFDR) of FIG. 5A is 60.17 dB, and an SFDR of FIG. 5B is 68.35 dB, and thus when the error correction method according to an exemplary embodiment of the present invention is applied, it is observed that SFDR of a circuit becomes much broader.

Also, a signal to noise and distortion ratio (SNDR) calculated based on the above data is 52.87 dB in FIG. 5A, and is 61.76 dB in FIG. 5B. Accordingly, when the error correction method according to an exemplary embodiment of the present invention is applied, superior SNDR is exhibited.

More specifically, when the error correction method is not applied, SNDR and effective resolution of 10 b is not satisfied by various factors. However, when the error correction method according to an exemplary embodiment of the present invention is used, a resolution of 10 b is sufficiently met.

According to the present invention, two bits having the same capacitance as a LSB enable a digital output error to be corrected. As a result, a spurious free dynamic range of a signal converter is increased, and an SNDR of an output signal is improved.

The above-described embodiments of the present invention can be implemented not only as an apparatus and a method but also as a program for executing a function corresponding to the construction according to the embodiments of the present invention and a recording medium having the program embodied thereon. Also, the program and recording medium for accomplishing the present invention can be easily construed by programmers skilled in the art to which the present invention pertains.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A successive approximation register (SAR) analog-digital converter (ADC) converting an analog voltage into a digital signal having a specific number of bits according to a successive approximation operation, comprising:
   a converting unit including a bit capacitor array corresponding to the number of bits and a correction capacitor array;
   a comparator configured to output a high or low voltage corresponding to each capacitor according to an output voltage of the converting unit; and
   a correction unit configured to correct the digital signal of the bit capacitor array according to the digital signal of the correction capacitor array among digital signals corresponding to the high or low voltage of the comparator.

2. A successive approximation register (SAR) analog-digital converter (ADC) converting an analog voltage into a digital signal having a specific number of bits according to a successive approximation operation, the SAR ADC comprising:
   a converting unit including a bit capacitor array corresponding to the number of bits and a correction capacitor array;
   a comparator configured to output a high or low voltage corresponding to each capacitor according to an output voltage of the converting unit; and
   a correction unit configured to correct the digital signal of the bit capacitor array according to the digital signal of the correction capacitor array among digital signals corresponding to the high or low voltage of the comparator,
   wherein the correction capacitor array is formed between an input terminal of the comparator and a first or second reference voltage, and includes a first correction capacitor and a second correction capacitor that are connected in an opposite manner.

3. The SAR ADC of claim 2, wherein the correction capacitor array performs a successive approximation operation after a successive approximation operation of the bit capacitor array is completed.

4. The SAR ADC of claim 3, wherein the first correction capacitor calculates the same value as a capacitor corresponding to a least significant bit (LSB) of the bit capacitor array.

5. The SAR ADC of claim 4, wherein the first and second correction capacitors have substantially the same capacitance as the capacitor of the bit capacitor array corresponding to the LSB.

6. The SAR ADC of claim 5, further comprising an offset compensation capacitor configured to compensate for an offset of the comparator.

7. The SAR ADC of claim 5, wherein the correction unit adds 1 to the digital signal of the bit capacitor array when the digital signals of the first and second correction capacitors are 11, outputs the digital signal of the bit capacitor array as it is when the digital signals of the first and second correction capacitors are 10 or 01, and deducts 1 from the digital signal of the bit capacitor array when the digital signals of the first and second correction capacitors are 00.

8. A method of driving a successive approximation register (SAR) analog-digital converter (ADC) including a bit capacitor array corresponding to each bit and first and second correction capacitors, comprising:
   sampling an input analog voltage in the bit capacitor array;
   performing a successive approximation operation from a bit capacitor corresponding to a most significant bit (MSB) to a bit capacitor corresponding to a least significant bit (LSB) to determine a digital value of 1 or 0;

performing a successive approximation operation to determine whether the first and second correction capacitors have the digital value of 1 or 0; and correcting the digital value of the bit capacitor according to the digital value of the first and second correction capacitors.

9. The method of claim 8, wherein the sampling of an input analog voltage comprises connecting the first correction capacitor to a first reference voltage, and the second correction capacitor to a second reference voltage during the sampling.

10. The method of claim 9, wherein the successive approximation operation is performed by connecting the corresponding capacitor to the first reference voltage, and connecting other capacitors to the second reference voltage.

11. The method of claim 10, wherein the correcting of the digital value of the bit capacitor comprises adding 1 to the digital value of the bit capacitor when the digital values of the first and second correction capacitors are 11, outputting the digital value of the bit capacitor as it is when the digital values of the first and second correction capacitors are 10 or 01, and deducting 1 from the digital value of the bit capacitor when the digital values of the first and second capacitors are 00.

* * * * *